United States Patent
Kim et al.

(10) Patent No.: US 12,282,068 B2
(45) Date of Patent: Apr. 22, 2025

(54) LITHIUM PRECIPITATION DETECTING APPARATUS AND METHOD

(71) Applicant: LG ENERGY SOLUTION, LTD., Seoul (KR)

(72) Inventors: Seung-Hyun Kim, Daejeon (KR); Hyun-Chul Lee, Daejeon (KR); Dong-Keun Kwon, Daejeon (KR); An-Soo Kim, Daejeon (KR); Chae-Bin Shin, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 128 days.

(21) Appl. No.: 18/008,330

(22) PCT Filed: Apr. 1, 2022

(86) PCT No.: PCT/KR2022/004718
§ 371 (c)(1),
(2) Date: Dec. 5, 2022

(87) PCT Pub. No.: WO2022/231150
PCT Pub. Date: Nov. 3, 2022

(65) Prior Publication Data
US 2023/0288487 A1    Sep. 14, 2023

(30) Foreign Application Priority Data
Apr. 28, 2021    (KR) .................. 10-2021-0055289

(51) Int. Cl.
*G01R 31/385* (2019.01)
*G01R 31/396* (2019.01)
(Continued)

(52) U.S. Cl.
CPC ......... *G01R 31/385* (2019.01); *G01R 31/396* (2019.01); *H01M 10/44* (2013.01); *H02J 7/0048* (2020.01)

(58) Field of Classification Search
CPC ... G01R 31/385; G01R 31/396; H01M 10/44; H01M 10/633; H02J 7/00
See application file for complete search history.

(56) References Cited

U.S. PATENT DOCUMENTS

2007/0216360 A1    9/2007   Matsui
2013/0099794 A1*   4/2013   Takahashi ............. H01M 10/48
                                                         324/427
(Continued)

FOREIGN PATENT DOCUMENTS

CN    107009905 A    8/2017
JP    8-273703 A     10/1996
(Continued)

OTHER PUBLICATIONS

International Search Report (PCT/ISA/210) issued in PCT/KR2022/004718 mailed on Jul. 13, 2022.
(Continued)

*Primary Examiner* — Neel D Shah
(74) *Attorney, Agent, or Firm* — Birch, Stewart, Kolasch & Birch, LLP

(57) ABSTRACT

A lithium precipitation detecting apparatus according to an embodiment of the present disclosure includes a measuring unit configured to calculate a charge amount of a battery in a charging process and calculate a discharge amount of the battery in a discharging process; and a control unit configured to estimate a state of charge (SOC) of the battery in the charging process and the discharging process and determine
(Continued)

whether lithium precipitation occurs in the battery based on the estimated SOC, the charge amount and the discharge amount.

15 Claims, 4 Drawing Sheets

(51) Int. Cl.
*H01M 10/44* (2006.01)
*H02J 7/00* (2006.01)

(56) References Cited

U.S. PATENT DOCUMENTS

| | | |
|---|---|---|
| 2013/0132011 A1 | 5/2013 | Mano et al. |
| 2014/0239915 A1* | 8/2014 | Takahashi ............ H01M 10/48 320/134 |
| 2017/0203660 A1 | 7/2017 | He et al. |
| 2017/0234930 A1 | 8/2017 | Lee et al. |
| 2017/0279171 A1* | 9/2017 | Ishibashi ............ H01M 10/486 |

FOREIGN PATENT DOCUMENTS

| | | |
|---|---|---|
| JP | 2010-19664 A | 1/2010 |
| JP | 2010-66232 A | 3/2010 |
| JP | 4497547 B2 | 7/2010 |
| JP | 2013-196820 A | 9/2013 |
| JP | 5454433 B2 | 3/2014 |
| JP | 5527412 B2 | 6/2014 |
| JP | 2017-117519 A | 6/2017 |
| JP | 6535890 B2 | 7/2019 |
| JP | 2020-140884 A | 9/2020 |
| JP | 2020-169968 A | 10/2020 |
| KR | 20-0173954 Y1 | 3/2000 |
| KR | 10-2008-0071294 A | 8/2008 |
| KR | 10-1897859 B1 | 9/2018 |

OTHER PUBLICATIONS

An et al., "A fast method for evaluating stability of lithium ion batteries at high C-rates," Elsevier, Journal of Power Sources, vol. 480, Sep. 9, 2020, pp. 1-8.
Extended European Search Report for European Application No. 22795984.8, dated Apr. 15, 2024.

* cited by examiner

LITHIUM PRECIPITATION DETECTING APPARATUS AND METHOD

TECHNICAL FIELD

The present application claims priority to Korean Patent Application No. 10-2021-0055289 filed on Apr. 28, 2021 in the Republic of Korea, the disclosures of which are incorporated herein by reference.

The present disclosure relates to a lithium precipitation detecting apparatus and method, more particularly, to a lithium precipitation detecting apparatus and method for detecting whether a lithium metal is precipitated to a battery cell.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Although many studies are being conducted on these batteries in terms of high capacity and high density, lifespan and safety improvement are also important. To this end, it is necessary to suppress the decomposition reaction with the electrolyte on the electrode surface, and to prevent overcharging and overdischarging.

In particular, it is necessary to prevent lithium from being precipitated (lithium plating, Li-plating) on the surface of the negative electrode. When lithium is precipitated on the surface of the negative electrode, it causes a side reaction with the electrolyte and changes the kinetic balance of the battery, which results in battery deterioration. In addition, since lithium metal precipitation on the negative electrode surface may cause an internal short circuit of the battery, there is a risk of ignition and explosion due to the internal short circuit. Therefore, it is necessary to develop a technology capable of detecting whether lithium metal is precipitated on the surface of the negative electrode.

DISCLOSURE

Technical Problem

The present disclosure is designed to solve the problems of the related art, and therefore the present disclosure is directed to providing a precipitation detecting apparatus and method capable of detecting whether metal lithium is precipitated in a non-destructive manner based on a charge amount and a discharge amount of a battery cell.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A lithium precipitation detecting apparatus according to one aspect of the present disclosure may comprise: a measuring unit configured to calculate a charge amount of a battery cell in a charging process and calculate a discharge amount of the battery cell in a discharging process; and a control unit configured to estimate a state of charge (SOC) of the battery cell in the charging process and the discharging process and determine whether lithium precipitation occurs in the battery cell based on the estimated SOC, the charge amount and the discharge amount.

The control unit may be configured to compare magnitudes a charge amount of the battery cell and a discharge amount of the battery cell and determine whether the lithium precipitation occurs in the battery cell according to the comparison result.

The control unit may be configured to determine that the lithium precipitation occurs, when the discharge amount exceeds the charge amount.

The control unit may be configured to determine whether the lithium precipitation occurs by comparing the discharge amount and the charge amount, when a SOC at a charging start time is identical to a SOC at a discharging end time and a SOC at a charging end time is identical to a SOC at a discharging start time.

The control unit may be configured to correct the discharge amount and the charge amount and determine whether the lithium precipitation occurs according to a comparison result of the corrected discharge amount and the corrected charge amount, when a SOC at a charging start time is different from a SOC at a discharging end time or a SOC at a charging end time is different from a SOC at a discharging start time.

The control unit may be configured to calculate a charging SOC deviation between the SOC at the charging start time and the SOC at the charging end time and correct the charge amount based on the calculated charging SOC deviation.

The control unit may be configured to calculate a discharging SOC deviation between the SOC at the discharging start time and the SOC at the discharging end time and correct the discharge amount based on the calculated discharging SOC deviation.

The control unit may be configured to send a charging C-rate and a discharging C-rate for the battery cell to a charging and discharging device that is capable of charging and discharging the battery cell.

The control unit may be configured to reduce the charging C-rate and the discharging C-rate and send the reduced charging C-rate and the reduced discharging C-rate to the charging and discharging device, when the discharge amount is equal to or smaller than the charge amount and a difference between the discharge amount and the charge amount is equal to or smaller than a preset criterion value.

The control unit may be configured to determine judgewhether the lithium precipitation occurs again based on a charge amount of the battery cell in the charging process according to the reduced charging C-rate and a discharge amount of the battery cell in the discharging process according to the reduced discharging C-rate.

The control unit may be configured to set the charging C-rate and the discharging C-rate to be identical.

The measuring unit may be configured to calculate the charge amount by integrating a charging current from a charging start time to a charging end time.

The measuring unit may be configured to calculate the discharge amount by integrating a discharging current from a discharging start time to a discharging end time.

A battery pack according to another aspect of the present disclosure may comprise the lithium precipitation detecting apparatus according to one aspect of the present disclosure.

A lithium precipitation detecting method according to still another aspect of the present disclosure may comprise: a charge/discharge amount calculating step of calculating a charge amount of a battery cell in a charging process and calculating a discharge amount of the battery cell in a discharging process; a SOC estimating step of estimating a state of charge (SOC) of the battery cell in the charging process and the discharging process; and a lithium precipitation determining step of judging whether lithium precipitation occurs in the battery cell based on the estimated SOC, the charge amount and the discharge amount.

Advantageous Effects

According to one aspect of the present disclosure, the lithium precipitation detecting apparatus has an advantage of quickly judging whether lithium is precipitated by comparing the charge amount and the discharge amount for a battery cell in operation.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
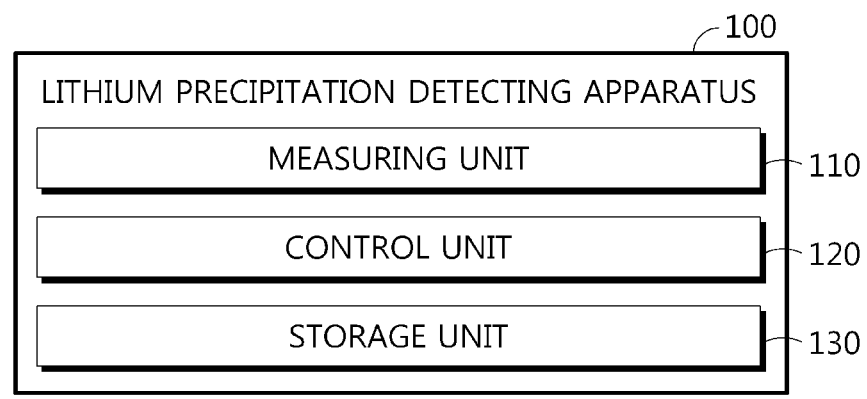
FIG. 1 is a diagram schematically showing a lithium precipitation detecting apparatus according to an embodiment of the present disclosure.

FIG. 1 is a diagram schematically showing a lithium precipitation detecting apparatus 100 according to an embodiment of the present disclosure.

Referring to FIG. 1, the lithium precipitation detecting apparatus 100 may include a measuring unit 110 and a control unit 120.

The measuring unit 110 may be configured to calculate a charge amount of a battery cell 10 in a charging process and calculate a discharge amount of the battery cell 10 in a discharging process.

Here, the battery cell 10 means a physically separable one independent cell having a negative electrode terminal and a positive electrode terminal. For example, a lithium-ion battery or a lithium polymer battery may be considered as the battery cell 10.

Specifically, the measuring unit 110 may be configured to calculate the charge amount by integrating a charging current from a charging start time to a charging end time. Also, the measuring unit 110 may be configured to calculate the discharge amount by integrating a discharging current from a discharging start time to a discharging end time.

Figure 2:
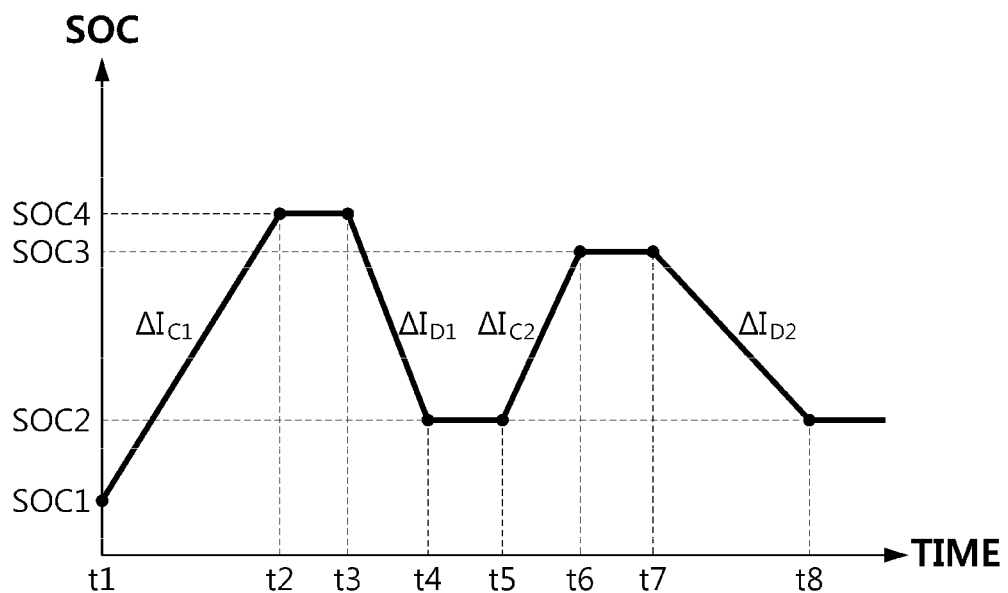
FIG. 2 is a diagram schematically showing a charging and discharging behavior of a battery cell according to an embodiment of the present disclosure.

FIG. 2 is a diagram schematically showing a charging and discharging behavior of the battery cell 10 according to an embodiment of the present disclosure.

In the embodiment of FIG. 2, the battery cell 10 may start charging at a time point t1 and end charging at a time point t2. In the charging process from the time point t1 to the time point t2, the measuring unit 110 may calculate a first charge amount ($\Delta I_{C1}$) by integrating the charging current of the battery cell 10. Thereafter, the battery cell 10 may be maintained in an idle state from the time point t2 to a time point t3.

The battery cell 10 may start discharging at the time point t3 and end discharging at a time point t4. In the discharging process from the time point t3 to the time point t4, the measuring unit 110 may calculate a first discharge amount ($\Delta I_{D1}$) by integrating the discharging current of the battery cell 10. Thereafter, the battery cell 10 may be maintained in an idle state from the time point t4 to a time point t5.

The battery cell 10 may start charging at the time point t5 and end charging at a time point t6. In the charging process from the time point t5 to the time point t6, the measuring unit 110 may calculate a second charge amount ($\Delta I_{C2}$) by integrating the charging current of the battery cell 10. Thereafter, the battery cell 10 may be maintained in an idle state from the time point t6 to a time point t7.

The battery cell 10 may start discharging at the time point t7 and end discharging at a time point t8. In the discharging process from the time point t7 to the time point t8, the measuring unit 110 may calculate a second discharge amount ($\Delta I_{D2}$) by integrating the discharging current of the battery cell 10. Thereafter, the battery cell 10 may be maintained in an idle state from the time point t8.

The control unit 120 may be configured to estimate a state of charge (SOC) of the battery cell 10 in the charging process and the discharging process.

Preferably, the control unit 120 may estimate the SOC of the battery cell 10 at a charging start time, a charging end time, a discharging start time, and a discharging end time.

For example, the control unit 120 may estimate the SOC of the battery cell 10 using an extended Kalman filter. To this end, the measuring unit 110 may be configured to further measure an open circuit voltage (OCV) of the battery cell 10. In addition, the control unit 120 may estimate the SOC at each time point based on the OCV measured at each of the charging start time, the charging end time, the discharging start time, and the discharging end time by the measuring unit 110.

As another example, the control unit 120 may estimate the SOC at the charging start time and the discharging start time using the extended Kalman filter, and estimate a SOC at the charging end time and the discharging end time using the Coulomb counting method based on the charge amount and the discharge amount calculated by the measuring unit 110.

In the embodiment of FIG. 2, for convenience of explanation, it is assumed that the SOC of the battery cell 10 during the time point t2 to the time point t3 and during the time point t4 to the time point t5 in which the battery cell 10 is maintained in an idle state is maintained identically. The control unit 120 may estimate the SOC of the battery cell at the time point t1 as SOC1, and may estimate the SOC of the battery cell 10 at the time point t2 as SOC4. The control unit 120 may estimate the SOC of the battery cell 10 at the time point t3 as SOC4, and may estimate the SOC of the battery cell 10 at the time point t4 as SOC2. The control unit 120 may estimate the SOC of the battery cell 10 at the time point t5 as SOC2, and may estimate the SOC of the battery cell 10 at the time point t6 as SOC3. The control unit 120 may estimate the SOC of the battery cell 10 at the time point t7 as SOC3, and may estimate the SOC of the battery cell 10 at the time point t8 as SOC2.

The control unit 120 may be configured to judge whether lithium precipitation occurs in the battery cell 10 based on the estimated SOC, the charge amount, and the discharge amount.

Specifically, the control unit 120 may be configured to compare the magnitudes of the charge amount and the discharge amount.

For example, in the embodiment of FIG. 2, the control unit 120 may compare the magnitudes of the first charge amount ($\Delta I_{C1}$) and the first discharge amount ($\Delta I_{D1}$). Also, the control unit 120 may compare the magnitudes of the second charge amount ($\Delta I_{C2}$) and the second discharge amount ($\Delta I_{D2}$).

In addition, the control unit 120 may be configured to judge whether the lithium precipitation occurs in the battery cell 10 according to the comparison result.

Specifically, when the discharge amount exceeds the charge amount, the control unit 120 may be configured to judge that lithium is precipitated.

For example, when the discharge amount is smaller than the charge amount, the control unit 120 may judge that lithium is not precipitated on the surface of the negative electrode of the battery cell 10. Conversely, when the discharge amount exceeds the charge amount, the control unit 120 may judge that lithium is precipitated on the surface of the negative electrode of the battery cell 10.

In general, in the process of manufacturing the battery cell 10, the negative electrode capacity is set larger than the positive electrode capacity. The value obtained by dividing the total capacity of the negative electrode by the total capacity of the positive electrode is called an N/P ratio, and the N/P ratio has a significant effect on the safety and capacity of the battery and thus generally has a value of 1 or more. Preferably, the battery cell 10 is manufactured so that the N/P ratio exceeds 1.

The lithium precipitation detecting apparatus 100 according to an embodiment of the present disclosure has advantages of judging a change behavior of the N/P ratio by comparing the charge amount and the discharge amount of the battery cell 10 in operation and quickly judging whether lithium precipitation occurs according to the change behavior of the N/P ratio. Therefore, there is an advantage of quickly judging whether lithium precipitation occurs, without analyzing the thickness change due to swelling of the battery cell 10 or performing volcano analysis (analyzing a Q–dV/dQ profile representing a corresponding relationship between a capacity (Q) and a differential voltage (dV/dQ) or a V–dQ/dV profile representing a corresponding relationship between a voltage (V) and a differential capacity (dQ/dV).

Meanwhile, the control unit 120 provided to the lithium precipitation detecting apparatus 100 may optionally include a processor, an application-specific integrated circuit (ASIC), another chipset, a logic circuit, a register, a communication modem, and a data processing device, and the like, known in the art to execute various control logics performed in the present disclosure. In addition, when the control logic is implemented in software, the control unit 120 may be implemented as a set of program modules. At this time, the program module may be stored in a memory and executed by the control unit 120. The memory may be provided in or out of the control unit 120, and may be connected to the control unit 120 by various well-known means.

In addition, the lithium precipitation detecting apparatus 100 may further include a storage unit 130. The storage unit 130 may store data or programs necessary for operation and function of each component of the lithium precipitation detecting apparatus 100, data generated in the process of performing the operation or function, or the like. The storage unit 130 is not particularly limited in its kind as long as it is a known information storage means that can record, erase, update and read data. As an example, the information storage means may include RAM, flash memory, ROM, EEPROM, registers, and the like. In addition, the storage unit 130 may store program codes in which processes executable by the control unit 120 are defined.

For example, the storage unit 130 may store the charge amount and the discharge amount calculated by the measuring unit 110. Also, the storage unit 130 may store the SOC of the battery cell 10 estimated by the control unit 120.

More specifically, when the SOC of the charging start time and the SOC of the discharging end time are identical and the SOC of the charging end time and the SOC of the discharging start time are identical, the control unit 120 may be configured to judge whether lithium precipitation occurs by comparing the discharge amount and the charge amount.

For example, in the embodiment of FIG. 2, the depth of discharge (DOD) in the charging process from the time point t5 to the time point t6 and the discharging process from the time point t7 to the time point t8 may be identical. Specifically, the DOD in the charging process and the DOD in the discharging process may be identical as "SOC3 −SOC2".

That is, when the DODs in the charging process and the discharging process are identical, the control unit 120 may directly compare the discharge amount and the charge amount calculated by the measuring unit 110. In addition, when the discharge amount exceeds the charge amount, the control unit 120 may judge that lithium metal is precipitated in the negative electrode of the battery cell 10.

On the other hand, in the embodiment of FIG. 2, the DOD in the charging process from the time point t1 to the time point t2 and the DOD in the discharging process from the time point t3 to the time point t4 may be different. Specifically, since the DOD in the charging process is "SOC4−SOC1" and the DOD in the discharging process is "SOC4−SOC2", the DOD in the charging process and the DOD in the discharging process may be different as much as "SOC2−SOC1".

As such, when the DODs in the charging process and the discharging process are different, it is not possible to accurately judge whether the lithium precipitation occurs in the battery cell 10 by directly comparing the charge amount and the discharge amount. This is because, since the DOD in the charging process is greater than the DOD in the discharging process, even when lithium metal is precipitated on the negative electrode of the battery cell 10, the discharge amount may be calculated to be less than the charge amount.

Accordingly, when the SOC at the charging start time and the SOC at the discharging end time are different or the SOC at the charging end time and the SOC at the discharging start time are different, the control unit 120 may be configured to correct the discharge amount and the charge amount and judge whether lithium precipitation occurs according to the comparison result of the corrected discharge amount and the corrected charge amount.

For example, in the embodiment of FIG. 2, the time point t1 that is a charging start time and the time point t4 that is a discharging end time may be different from each other. In this case, when judging whether lithium precipitation occurs based on the result of directly comparing the first charge amount ($\Delta I_{C1}$) and the first discharge amount ($\Delta I_{D1}$), the result may be inaccurate. Therefore, the control unit 120 may correct the first charge amount ($\Delta I_{C1}$) and the first discharge amount ($\Delta I_{D1}$), respectively.

Specifically, the control unit 120 may be configured to calculate a charging SOC deviation between the SOC at the charging start time and the SOC at the charging end time and correct the charge amount based on the calculated charging SOC deviation.

For example, in the embodiment of FIG. 2, the control unit 120 may calculate the formula of "SOC4−SOC1" to calculate a charging SOC deviation between the SOC at the time point t1 and the SOC at the time point t2. In addition, the control unit 120 may correct the first charge amount ($\Delta I_{C1}$) by calculating the formula of "the first charge amount ($\Delta I_{C1}$)÷(SOC4−SOC1)".

In addition, the control unit 120 may be configured to calculate a discharging SOC deviation between the SOC at the discharging start time and the SOC at the discharging end time and correct the discharge amount based on the calculated discharging SOC deviation.

For example, in the embodiment of FIG. 2, the control unit 120 may calculate the formula of "SOC4−SOC2" to calculate a discharging SOC deviation between the SOC at the time point t3 and the SOC at the time point t4. In addition, the control unit 120 may correct the first discharge amount ($\Delta I_{D1}$) by calculating the formula of "the first discharge amount ($\Delta I_{D1}$)÷(SOC4−SOC2)".

In addition, the control unit 120 may judge whether lithium precipitation occurs based on a result of comparing the magnitudes of the corrected first charge amount and the corrected first discharge amount.

For example, when the corrected first discharge amount exceeds the corrected first charge amount, the control unit 120 may judge that lithium is precipitated in the battery cell 10. Conversely, if the corrected first discharge amount is smaller than or equal to the corrected first charge amount, the control unit 120 may judge that lithium is not precipitated in the battery cell 10.

That is, when the DOD in the charging process and the DOD in the discharging process are different, the lithium precipitation detecting apparatus 100 may more accurately judge whether lithium precipitation occurs based on the corrected discharge amount and the corrected charge amount.

Figure 3:
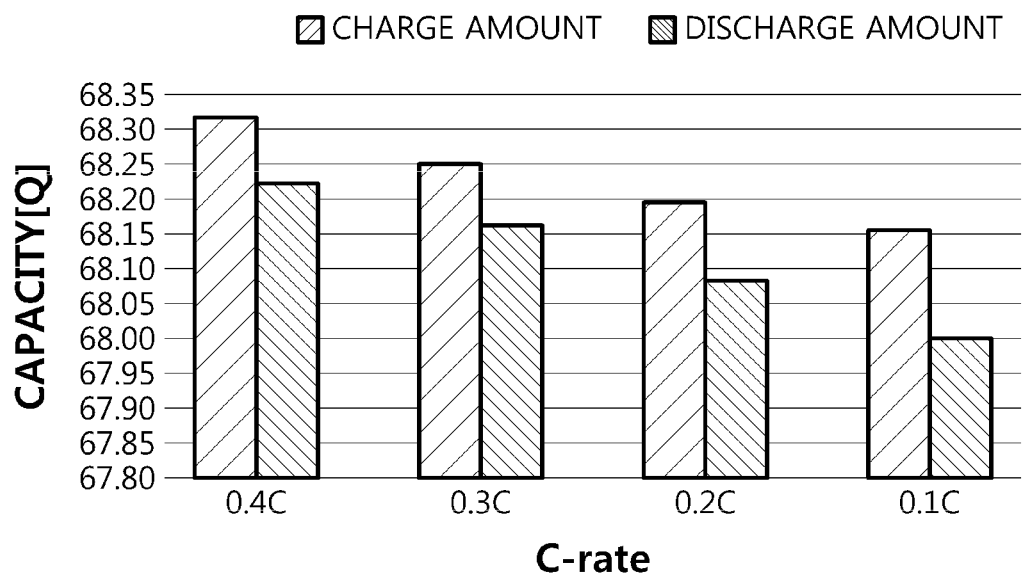
FIGS. 3 and 4 are diagrams schematically showing a charge amount and a discharge amount of a first cell according to an embodiment of the present disclosure.
Figure 4:
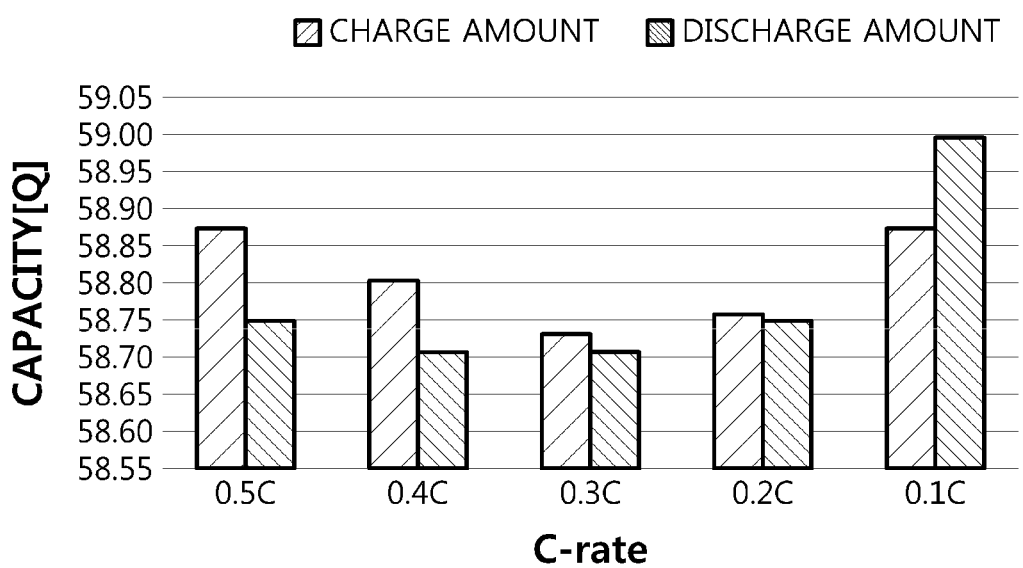

FIGS. 3 and 4 are diagrams schematically showing a charge amount and a discharge amount of a first cell according to an embodiment of the present disclosure.

Specifically, FIG. 3 is a diagram showing a charge amount and a discharge amount according to a C-rate (Current rate), when the first cell is in a BOL (Beginning of Life) state. FIG. 4 is a diagram showing a charge amount and a discharge amount according to a C-rate when the first cell is in a middle of life (MOL) state. Here, the first cell may be charged from 3% SOC to 98% SOC and discharged from 98% SOC to 3% SOC.

Here, the charging and discharging C-rates may be set by the control unit 120 in a range of 1 C and 0.05 C. Preferably, the charging and discharging C-rates may be set in a range of 0.5 C and 0.05 C.

Referring to FIG. 3, when the first cell is in the BOL state, the charge amount may always be greater than the discharge amount. That is, when the charging C-rate and the discharging C-rate are 0.4 C, 0.3 C, 0.2 C and 0.1 C, respectively, the charge amount may be greater than or equal to the discharge amount. Accordingly, the control unit 120 may judge that lithium metal is not precipitated in the first cell in the BOL state.

On the other hand, referring to FIG. 4, when the first cell is in the MOL state, when the charging C-rate and the discharging C-rate are 0.1 C, the discharge amount may exceed the charge amount. In this case, since the discharge amount exceeds the charge amount, the control unit 120 may judge that lithium metal is precipitated in the first cell in the MOL state.

Figure 5:
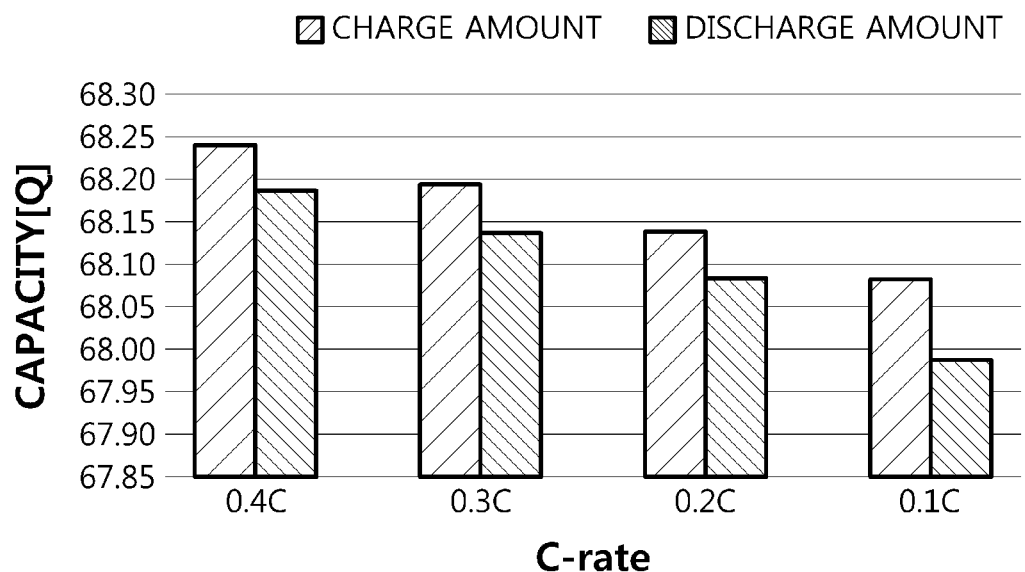
FIGS. 5 and 6 are diagrams schematically showing a charge amount and a discharge amount of a second cell according to an embodiment of the present disclosure.
Figure 6:
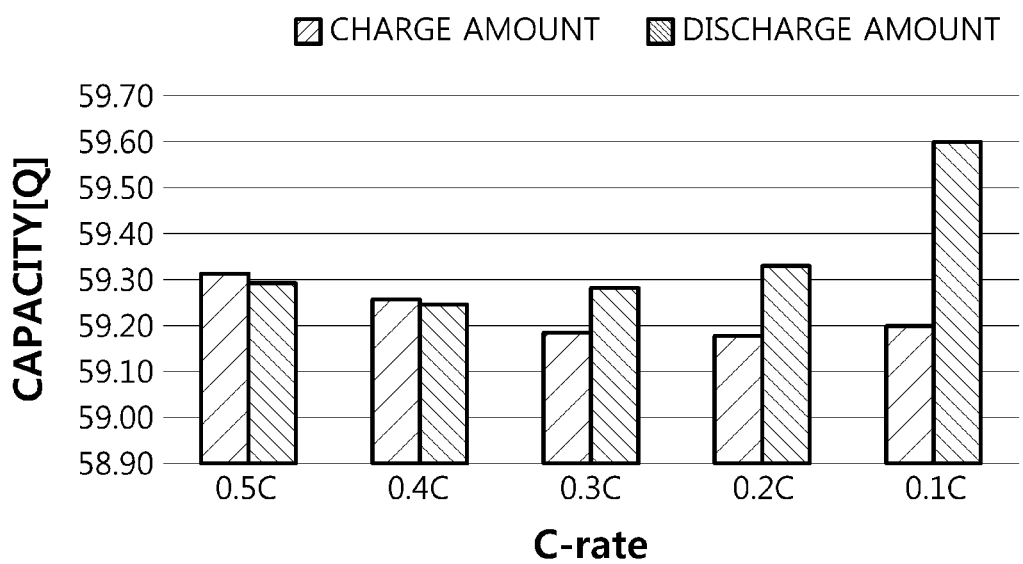

FIGS. 5 and 6 are diagrams schematically showing a charge amount and a discharge amount of a second cell according to an embodiment of the present disclosure.

Specifically, FIG. 5 is a diagram showing a charge amount and a discharge amount according to the C-rate, when the second cell is in the BOL state. FIG. 6 is a diagram showing a charge amount and a discharge amount according to the C-rate, when the second cell is in the MOL state. Here, the second cell may be charged from 3% SOC to 98% SOC and discharged from 98% SOC to 3% SOC.

Referring to FIG. 5, when the second cell is in the BOL state, the charge amount may always be greater than the discharge amount. That is, when the charging C-rate and the discharging C-rate are 0.4 C, 0.3 C, 0.2 C and 0.1 C, respectively, the charge amount may be greater than or equal to the discharge amount. Accordingly, the control unit 120 may judge that lithium metal is not precipitated in the second cell in the BOL state.

On the other hand, referring to FIG. 6, when the second cell is in the MOL state, when the charging C-rate and the discharging C-rate are 0.3 C, 0.2 C or 0.1 C, the discharge amount may exceed the charge amount. In this case, since the discharge amount exceeds the charge amount, the control unit 120 may judge that lithium metal is precipitated in the second cell in the MOL state.

Since the battery cell 10 is manufactured to have an N/P ratio of 1 or more (preferably, more than 1), in a low-current (e.g., 0.1 C) charging and discharging process, the charge amount may always be equal to or greater than the discharge amount in the battery cell 10 in a BOL state. On the other hand, in the battery cell 10 in the degenerated MOL state, metal lithium may be precipitated on the surface of the negative electrode, and the discharge amount may be reversely greater than the charge amount in the low-current charging and discharging process by the precipitated metal lithium. Accordingly, the lithium precipitation detecting apparatus 100 may quickly and accurately detect whether lithium precipitation occurs by comparing the charge amount and the discharge amount of the battery cell 10.

For example, the control unit 120 may be configured to set the charging C-rate and the discharging C-rate to be identical.

Referring to the embodiments of FIGS. 3 to 6, the charge amount may vary as the charging C-rate changes, and the discharge amount may vary as the discharging C-rate changes.

As a specific example, in the embodiment of FIG. 3, when the first cell is charged at 0.2 C or 0.1 C and discharged at 0.4 C, the discharge amount may exceed the charge amount. That is, even though lithium is not precipitated in the first cell in the BOL state, the discharge amount may exceed the charge amount due to the difference between the charging C-rate and the discharging C-rate.

Accordingly, when detecting whether lithium precipitation occurs, the control unit 120 may set the charging C-rate and the discharging C-rate to be identical, thereby preventing erroneous detection of lithium precipitation caused by the C-rate difference.

The control unit 120 may be configured to send the charging C-rate and the discharging C-rate for the battery cell 10 to a charging and discharging device 2 that is capable of charging and discharging the battery cell 10.

Here, the charging and discharging device 2 may be connected to the battery cell and configured to charge the battery cell 10 according to the charging C-rate set by the control unit 120. In addition, the charging and discharging device 2 may be configured to discharge the battery cell 10 according to the discharging C-rate set by the control unit 120.

When the discharge amount is smaller than or equal to the charge amount and the difference between the discharge amount and the charge amount is smaller than or equal to a preset criterion value, the control unit 120 may be configured to reduce the charging C-rate and the discharging C-rate and send the reduced charging C-rate and the reduced discharging C-rate to the charging and discharging device 2.

For example, in the embodiment of FIG. 4, it is assumed that the control unit 120 sets the charging C-rate and the discharging C-rate to 0.2 C, and the difference between the charge amount and the discharge amount calculated by the measuring unit 110 is equal to or smaller than the criterion value. The control unit 120 may reduce the charging C-rate and the discharging C-rate to 0.1 C smaller than 0.2 C, and send information on the reduced charging C-rate and the reduced discharging C-rate to the charging and discharging device 2.

In addition, the control unit 120 may be configured to judge whether lithium precipitation occurs again based on the charge amount of the battery cell 10 in the charging process according to the reduced charging C-rate and the discharge amount of the battery cell 10 in the discharging process according to the reduced discharging C-rate.

In the former embodiment, the charging and discharging device 2 may receive the charging C-rate and the discharging C-rate reduced to 0.1 C from the control unit 120, and discharge the battery cell 10 at the received charging C-rate (0.1 C) and the received discharging C-rate (0.1 C). Based on 0.1 C, the discharge amount of the battery cell 10 exceeds the charge amount, so the control unit 120 may judge that lithium is precipitated in the first cell in the MOL state.

As another example, in the embodiment of FIG. 6, it is assumed that the control unit 120 sets the charging C-rate and the discharging C-rate to 0.5 C, and the difference between the charge amount and the discharge amount calculated by the measuring unit 110 is equal to or smaller than the criterion value. The control unit 120 may reduce the charging C-rate and the discharging C-rate to 0.4 C smaller than 0.5 C, and send information on the reduced charging C-rate and the reduced discharging C-rate to the charging and discharging device 2. The charging and discharging device 2 may receive the charging C-rate and the discharging C-rate reduced to 0.4 C from the control unit 120, and charge and discharge the battery cell 10 at the received charging C-rate (0.4 C) and the reduced discharging C-rate (0.4 C). Based on 0.4 C, the discharge amount of the battery cell 10 is smaller than or equal to the charge amount, but the difference between the discharge amount and the charge amount may still be smaller than or equal to the criterion value.

The control unit 120 may reduce the charging C-rate and the discharging C-rate to 0.3 C smaller than 0.4 C, and send information on the reduced charging C-rate and the reduced discharging C-rate to the charging and discharging device 2. The charging and discharging device 2 may receive the charging C-rate and the discharging C-rate reduced to 0.3 C from the control unit 120, and charge and discharge the battery cell 10 at the received charging C-rate (0.3 C) and the reduced discharging C-rate (0.3 C). Based on 0.3 C, since the discharge amount of the battery cell 10 exceeds the charge amount, the control unit 120 may judge that lithium is precipitated in the second cell in the MOL state.

That is, when the difference between the discharge amount and the charge amount is smaller than or equal to the criterion value, the lithium precipitation detecting apparatus 100 may judge whether lithium precipitation occurs again while reducing the charging C-rate and the discharging C-rate. Therefore, the lithium precipitation detecting apparatus 100 has advantages of quickly detecting whether lithium precipitation occurs at a relatively high C-rate in an initial stage and precisely detecting whether lithium precipitation occurs while lowering the C-rate when the difference between the discharge amount and the charge amount is smaller than or equal to the criterion value.

In addition, when the discharge amount is smaller than or equal to the charge amount and a first difference between the discharge amount and the charge amount is greater than or equal to the criterion value, the control unit 120 may reduce the charging C-rate and the discharging C-rate and then calculate a second difference between the discharge amount and the charge amount again. If the second difference is also greater than or equal to the criterion value but the second difference is smaller than the first difference, the control unit 120 may reduce the charging C-rate and the discharging C-rate again and then calculate a third difference between the discharge amount and the charge amount.

If the difference between the discharge amount and the charge amount due to the charging C-rate and the discharging C-rate is greater than or equal to the criterion value but the difference between the discharge amount and the charge amount calculated according to the reduced charging C-rate and the reduced discharging C-rate tends to gradually decrease, the control unit 120 may compare the discharge amount and the charge amount while reducing the charging C-rate and the discharging C-rate.

That is, if the difference between the charge amount and the discharge amount also tends to decrease as the charging C-rate and the discharging C-rate are reduced, since it may be judged that lithium metal is precipitated in the low-current charging and discharging, the control unit 120 may compare the charge amount and the discharge amount while reducing the charging C-rate and the discharging C-rate.

For example, in the embodiment of FIG. 4, it is assumed that the charging C-rate and the discharging C-rate are initially set to 0.4 C. When the charging and discharging C-rates are 0.4 C, the discharge amount may be smaller than the charge amount, and the first difference between the discharge amount and the charge amount may be greater than or equal to the criterion value. The control unit 120 may reduce the charging C-rate and the discharging C-rate to 0.3 C and compare the discharge amount and the charge amount. When the charging and discharging C-rates are 0.3 C, the discharge amount is smaller than the charge amount, and the second difference between the discharge amount and the charge amount is greater than or equal to the criterion value. However, since the second difference is reduced than the first difference, the control unit 120 may reduce the charging C-rate and the discharging C-rate to 0.2 C and compare the discharge amount and the charge amount again. When the charging and discharging C-rates are 0.2 C, the discharge amount is smaller than the charge amount, and the third difference between the discharge amount and the charge amount is smaller than or equal to the criterion value. However, since the third difference is reduced than the second difference, the control unit 120 may reduce the charging C-rate and the discharging C-rate to 0.1 C and compare the discharge amount and the charge amount again. When the charging and discharging C-rates are 0.1 C, since the discharge amount exceeds the charge amount, the control unit 120 may judge that lithium metal is precipitated in the battery cell 10.

That is, when the discharge amount is smaller than the charge amount but the difference between the discharge amount and the charge amount tends to decrease as the charging and discharging C-rates decreases, the lithium precipitation detecting apparatus 100 has an advantage of judging whether lithium metal is precipitated while reducing the charging and discharging C-rates.

The lithium precipitation detecting apparatus 100 according to the present disclosure may be applied to a BMS (Battery Management System). That is, the BMS according to the present disclosure may include the lithium precipitation detecting apparatus 100 described above. In this configuration, at least some components of the lithium precipitation detecting apparatus 100 may be implemented by supplementing or adding functions of the configuration included in the conventional BMS. For example, the measuring unit 110, the control unit 120 and the storage unit 130 of the lithium precipitation detecting apparatus 100 may be implemented as components of the BMS.

In addition, the lithium precipitation detecting apparatus 100 according to the present disclosure may be provided to a battery pack 1. That is, the battery pack 1 according to the present disclosure may include the lithium precipitation detecting apparatus 100 described above and at least one battery cell 10. In addition, the battery pack 1 may further include electrical equipment (a relay, a fuse, etc.) and a case.

Figure 7:
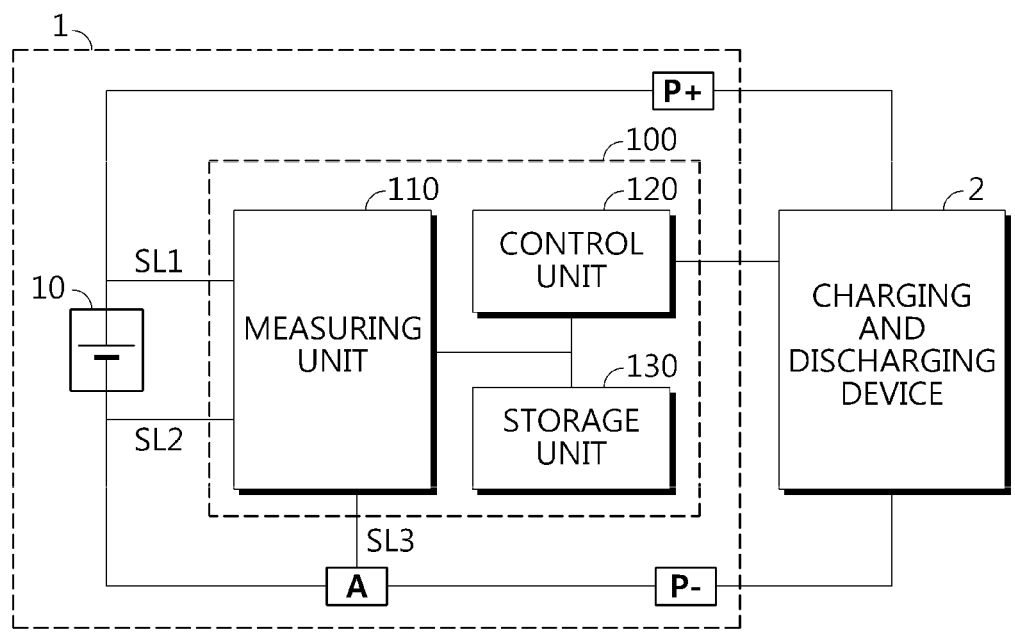
FIG. 7 is a diagram schematically showing an exemplary configuration of a battery pack according to another embodiment of the present disclosure.

FIG. 7 is a diagram schematically showing an exemplary configuration of a battery pack 1 according to another embodiment of the present disclosure.

Referring to FIG. 7, the battery pack 1 may include a battery cell 10 and a lithium precipitation detecting apparatus 100.

A positive electrode terminal of battery cell 10 may be connected to a positive electrode terminal (P+) of the battery pack 1, and a negative electrode terminal of the battery cell 10 may be connected to a negative electrode terminal (P−) of the battery pack 1.

The measuring unit 110 may be connected to a first sensing line SL1, a second sensing line SL2, and a third sensing line SL3. Specifically, the measuring unit 110 may be connected to the positive electrode terminal of the battery cell 10 through the first sensing line SL1, and may be connected to the negative electrode terminal of the battery cell 10 through the second sensing line SL2. The measuring unit 110 may measure the voltage of the battery cell 10 based on the voltage measured at each of the first sensing line SL1 and the second sensing line SL2.

In addition, the measuring unit 110 may be connected to a current measuring unit A through the third sensing line SL3. For example, the current measuring unit A may be an ammeter or a shunt resistor capable of measuring a charging current and a discharging current of the battery cell 10. The measuring unit 110 may calculate the charge amount by measuring the charging current of the battery cell 10 through the third sensing line SL3. Also, the measuring unit 110 may to calculate the discharge amount by measuring the discharging current of the battery cell 10 through the third sensing line SL3.

The charging and discharging device 2 may have one end connected to the positive electrode terminal (P+) of the battery pack 1 and the other end connected to the negative electrode terminal (P−) of the battery pack 1. Therefore, the positive electrode terminal of the battery cell 10, the positive electrode terminal (P+) of the battery pack 1, the charging and discharging device 2, the negative electrode terminal (P−) of the battery pack 1, and the negative electrode terminal of the battery cell 10 may be electrically connected.

In addition, the charging and discharging device 2 may be connected to communicate with the control unit 120. The charging and discharging device 2 may charge the battery cell 10 according to the charging C-rate received from the control unit 120 and discharge the battery cell 10 according to the discharging C-rate received from the control unit 120.

Figure 8:
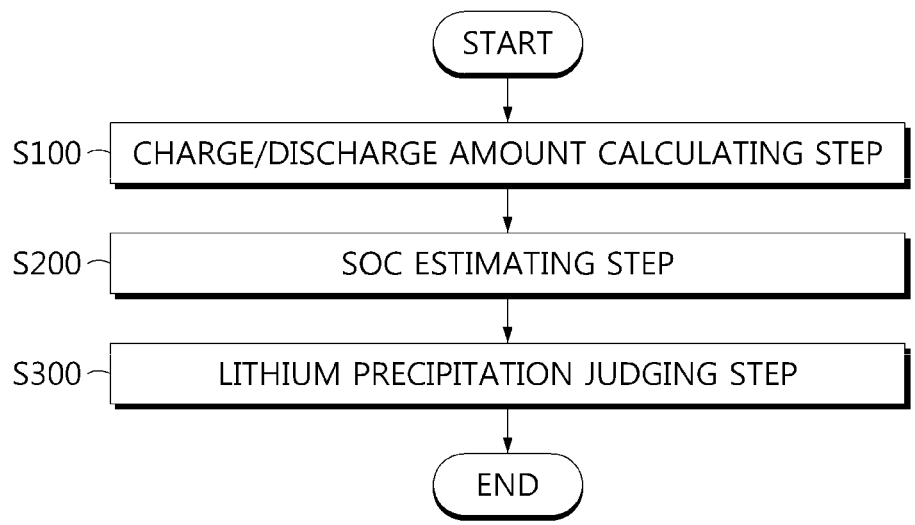
FIG. 8 is a diagram schematically showing a lithium precipitation detecting method according to still another embodiment of the present disclosure.

FIG. 8 is a diagram schematically showing a lithium precipitation detecting method according to still another embodiment of the present disclosure.

Preferably, each step of the lithium precipitation detecting method may be performed by the lithium precipitation detecting apparatus 100. Hereinafter, for convenience of explanation, content overlapping with the previously described content will be omitted or briefly described.

Referring to FIG. 8, the lithium precipitation detecting method may include a charge/discharge amount calculating step (S100), an SOC estimating step (S200), and a lithium precipitation judging step (S300).

The charge/discharge amount calculating step (S100) is a step of calculating a charge amount of a battery cell 10 in a charging process and calculating a discharge amount of the battery cell 10 in a discharging process, and may be performed by the measuring unit 110.

For example, the measuring unit 110 may calculate the charge amount by accumulating a charging current in the charging process, and calculate the discharge amount by accumulating a discharging current in the discharging process. Preferably, the charging C-rate in the charging process and the discharging C-rate in the discharging process may be identical.

The SOC estimating step (S200) is a step of estimating a SOC of the battery cell in the charging process and the discharging process, and may be performed by the control unit 120.

For example, the control unit 120 may estimate the SOC of the battery cell 10 at each of a charging start time, a charging end time, a discharging start time, and a discharging end time. In the SOC estimating process, an extended Kalman filter and/or an ampere counting method may be applied.

The lithium precipitation judging step (S300) is a step of judging whether lithium precipitation occurs in the battery cell 10 based on the estimated SOC, the charge amount, and the discharge amount, and may be performed by the control unit 120.

Specifically, the control unit 120 may judge whether the SOC at the charging start time and the SOC at the discharging end time are identical and whether the SOC at the charging end time and the SOC at the discharging start time are identical.

For example, when the SOC at the charging start time and the SOC at the discharging end time are identical and the SOC at the charging end time and the SOC at the discharging start time are identical, the control unit 120 may judge whether lithium precipitation occurs in the battery cell 10 based on a result of directly calculating the discharge amount and the charge amount calculated by the measuring unit 110.

As another example, when the SOC at the charging start time and the SOC at the discharging end time are different or the SOC at the charging end time and the SOC at the discharging start time are different, the control unit 120 may correct the charge amount and the discharge amount calculated by the measuring unit 110. Specifically, the control unit 120 may correct the charge amount according to a SOC deviation in the charging process and correct the discharge amount according to a SOC deviation in the discharging process. In addition, the control unit 120 may judge whether lithium precipitation occurs in the battery cell 10 based on a result of directly comparing the corrected charge amount and the corrected discharge amount.

The lithium precipitation detecting method has an advantage of quickly and accurately diagnosing whether lithium metal is precipitated by comparing the charge amount and the discharge amount in the charging and discharging process of the battery cell 10.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
2: charging and discharging device
10: battery cell
100: lithium precipitation detecting apparatus
110: measuring unit
120: control unit
130: storage unit

What is claimed is:

1. A lithium precipitation detecting apparatus, comprising:
a measuring unit configured to electrically connect to a battery cell to measure a charge current of the battery cell in a charging process and a discharge current of the battery cell in a discharging process, calculate a charge amount of the battery cell based on the measured charge current in the charging process and calculate a discharge amount of the battery cell based on the measured discharge current in the discharging process; and
a control unit configured to estimate a state of charge (SOC) of the battery cell in the charging process and the discharging process and determine whether lithium precipitation occurs in the battery cell based on the estimated SOC, the charge amount and the discharge amount,
wherein the control unit is configured to compare magnitudes of the charge amount of the battery cell and the discharge amount of the battery cell and determine whether the lithium precipitation occurs in the battery cell according to a comparison result, and
wherein the control unit is configured to set a charging C-rate and a discharging C-rate based on a determination result and send information on the charging C-rate and the discharging C-rate to a charging and discharging device external to the lithium precipitation detecting apparatus.

2. The lithium precipitation detecting apparatus according to claim 1,
wherein the control unit is configured to determine that the lithium precipitation occurs, when the discharge amount exceeds the charge amount.

3. The lithium precipitation detecting apparatus according to claim 1,
wherein the control unit is configured to determine whether the lithium precipitation occurs by comparing the discharge amount and the charge amount, when a SOC at a charging start time is identical to a SOC at a discharging end time and a SOC at a charging end time is identical to a SOC at a discharging start time.

4. The lithium precipitation detecting apparatus according to claim 1,
wherein the control unit is configured to correct the discharge amount and the charge amount and determine whether the lithium precipitation occurs according to a comparison result of the corrected discharge amount and the corrected charge amount, when a SOC at a charging start time is different from a SOC at a discharging end time or a SOC at a charging end time is different from a SOC at a discharging start time.

5. The lithium precipitation detecting apparatus according to claim 4,
wherein the control unit is configured to calculate a charging SOC deviation between the SOC at the charging start time and the SOC at the charging end time and correct the charge amount based on the calculated charging SOC deviation, and
wherein the control unit is configured to calculate a discharging SOC deviation between the SOC at the discharging start time and the SOC at the discharging end time and correct the discharge amount based on the calculated discharging SOC deviation.

6. The lithium precipitation detecting apparatus according to claim 1,
wherein the control unit is configured to send the information to the charging and discharging device that is capable of charging and discharging the battery cell.

7. The lithium precipitation detecting apparatus according to claim 6,
wherein the control unit is configured to reduce the charging C-rate and the discharging C-rate and send the reduced charging C-rate and the reduced discharging C-rate to the charging and discharging device, when the discharge amount is equal to or smaller than the charge amount and a difference between the discharge amount and the charge amount is equal to or smaller than a preset criterion value.

8. The lithium precipitation detecting apparatus according to claim 6,
wherein the control unit is configured to set the charging C-rate and the discharging C-rate to be identical.

9. The lithium precipitation detecting apparatus according to claim 7,
wherein the control unit is configured to determine whether the lithium precipitation occurs again based on a charge amount of the battery cell in the charging process according to the reduced charging C-rate and a discharge amount of the battery cell in the discharging process according to the reduced discharging C-rate.

10. The lithium precipitation detecting apparatus according to claim 1,
wherein the measuring unit is configured to calculate the charge amount by integrating a charging current from a charging start time to a charging end time, and
wherein the measuring unit is configured to calculate the discharge amount by integrating a discharging current from a discharging start time to a discharging end time.

11. A battery pack, comprising the lithium precipitation detecting apparatus according to claim 1.

12. The lithium precipitation detecting apparatus according to claim 1, further comprising a storage configured to store the charge amount and the discharge amount calculated by the measuring unit, and the estimated SOC of the battery cell in the charging process and the discharging process.

13. A battery management system comprising:
the lithium precipitation detecting apparatus of claim 1; and
the charging and discharging device configured to control a charging and discharging of the battery cell based on the information received from the lithium precipitation detecting apparatus.

14. A lithium precipitation detecting method, comprising:
by a measuring unit electrically connected to a battery cell, measuring a charge current of the battery cell in a charging process and a discharge current of the battery cell in a discharging process;
by the measuring unit, calculating a charge amount of the battery cell in the charging process and calculating a discharge amount of the battery cell in the discharging process;
by a control unit, estimating a state of charge (SOC) of the battery cell in the charging process and the discharging process; and
determining whether lithium precipitation occurs in the battery cell based on the estimated SOC, the charge amount and the discharge amount,
wherein the determining whether the lithium precipitation occurs includes comparing magnitudes of the charge amount of the battery cell and the discharge amount of the battery cell and determining whether the lithium precipitation occurs in the battery cell according to a comparison result, and
wherein the control unit is configured to set a charging C-rate and a discharging C-rate based on a determination result and send information on the charging C-rate and the discharging C-rate to a device external to the lithium precipitation detecting apparatus.

15. The lithium precipitation detecting method according to claim 14, further comprising correcting the discharge amount and the charge amount and determining whether the lithium precipitation occurs according to a comparison result of the corrected discharge amount and the corrected charge amount, when a SOC at a charging start time is different from a SOC at a discharging end time or a SOC at a charging end time is different from a SOC at a discharging start time.

* * * * *